US009721970B2

(12) United States Patent
Balakrishnan et al.

(10) Patent No.: US 9,721,970 B2
(45) Date of Patent: Aug. 1, 2017

(54) GATE ALL-AROUND FINFET DEVICE AND A METHOD OF MANUFACTURING SAME

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/136,133

(22) Filed: Apr. 22, 2016

(65) Prior Publication Data

US 2016/0380003 A1 Dec. 29, 2016

Related U.S. Application Data

(63) Continuation of application No. 14/752,193, filed on Jun. 26, 2015, now Pat. No. 9,349,868.

(51) Int. Cl.
*H01L 21/84* (2006.01)
*H01L 27/12* (2006.01)
(Continued)

(52) U.S. Cl.
CPC .... *H01L 27/1211* (2013.01); *H01L 21/02233* (2013.01); *H01L 21/02532* (2013.01);
(Continued)

(58) Field of Classification Search
CPC ......... H01L 21/02532; H01L 21/02554; H01L 21/302; H01L 21/32; H01L 29/42392;
(Continued)

(56) References Cited

U.S. PATENT DOCUMENTS 5,965,914 A * 10/1999 Miyamoto ........ H01L 29/42392
257/331
8,698,128 B2 4/2014 Sleight et al.
(Continued)

OTHER PUBLICATIONS

Ta-Chuan Liao et al., "Novel Gate-All-Around Poly-Si TFTs With Multiple Nanowire Channels," IEEE Electron Device Letters, Aug. 2008, pp. 889-891, vol. 29, No. 8.
(Continued)

*Primary Examiner* — Jarrett Stark
*Assistant Examiner* — Shahed Ahmed
(74) *Attorney, Agent, or Firm* — Louis J. Percello; Ryan, Mason & Lewis, LLP (57) ABSTRACT

A method for manufacturing a fin field-effect transistor (FinFET) device, comprises patterning a first layer on a substrate to form at least one fin, patterning a second layer under the first layer to remove a portion of the second layer on sides of the at least one fin, forming a sacrificial gate electrode on the at least one fin, and a spacer on the sacrificial gate electrode, selectively removing the sacrificial gate electrode, depositing an oxide layer on top and side portions of the at least one fin corresponding to a channel region of the at least one fin, performing thermal oxidation to condense the at least one fin in the channel region until a bottom portion of the at least one fin is undercut, and stripping a resultant oxide layer from the thermal oxidation, leaving a gap in the channel region between a bottom portion of the at least one fin and the second layer.

10 Claims, 12 Drawing Sheets (51) Int. Cl.
　　　H01L 29/78　　　(2006.01)
　　　H01L 29/66　　　(2006.01)
　　　H01L 21/02　　　(2006.01)
　　　H01L 21/32　　　(2006.01)
　　　H01L 21/302　　(2006.01)
　　　H01L 29/423　　(2006.01)
　　　H01L 29/786　　(2006.01)
　　　H01L 29/49　　　(2006.01)
　　　H01L 29/51　　　(2006.01)
(52) U.S. Cl.
　　　CPC ...... *H01L 21/02554* (2013.01); *H01L 21/302* (2013.01); *H01L 21/32* (2013.01); *H01L 21/845* (2013.01); *H01L 29/42392* (2013.01); *H01L 29/495* (2013.01); *H01L 29/4966* (2013.01); *H01L 29/517* (2013.01); *H01L 29/6681* (2013.01); *H01L 29/66545* (2013.01); *H01L 29/66818* (2013.01); *H01L 29/785* (2013.01); *H01L 29/7856* (2013.01); *H01L 29/78696* (2013.01); *H01L 21/02255* (2013.01); *H01L 2029/7858* (2013.01)
(58) Field of Classification Search
　　　CPC ........... H01L 29/66545; H01L 29/6681; H01L 29/66818; H01L 29/785; H01L 29/7856; H01L 29/78696
　　　USPC ......... 257/288, 368, 369; 438/151, 197, 199
　　　See application file for complete search history.

(56) References Cited

U.S. PATENT DOCUMENTS

| | | |
|---|---|---|
| 8,900,935 B2 | 12/2014 | Guo et al. |
| 8,936,972 B2 | 1/2015 | Bangsaruntip et al. |
| 8,956,942 B2 | 2/2015 | Loubet et al. |
| 8,969,145 B2 | 3/2015 | Chang et al. |
| 9,024,368 B1 | 5/2015 | Yu et al. |
| 2008/0171407 A1 | 7/2008 | Nakabayashi et al. |
| 2013/0320455 A1 | 12/2013 | Cappellani et al. |
| 2014/0175554 A1 | 6/2014 | Loubet et al. |
| 2015/0056781 A1 | 2/2015 | Akarvardar et al. |
| 2016/0086805 A1* | 3/2016 | Xu .................... H01L 21/28079 257/402 |

OTHER PUBLICATIONS

List of IBM Patents or Patent Applications Treated as Related.

* cited by examiner

GATE ALL-AROUND FINFET DEVICE AND A METHOD OF MANUFACTURING SAME

TECHNICAL FIELD

The field generally relates to fin field-effect transistor (FinFET) devices and methods of manufacturing same and, in particular, to gate-all-around FinFET devices formed using condensation.

BACKGROUND

Fin field-effect transistor (FinFET) devices include a transistor architecture that uses raised source-to-drain channel regions, referred to as fins. A FinFET device can be built on a silicon-on-insulator (SOI) substrate, where a semiconductor material, such as silicon, is patterned into a fin-like shape and functions as the channel of the transistor.

A gate can be wrapped around and over the fin. A double or dual gate structure includes a gate oxide and gate contact formed on two sides of the channel. A 3D or tri-gate FinFET includes a gate structure wrapped on three sides of a fin. Gate-all-around FinFETs include gate structures that surround the channel region on all sides, e.g., on all four sides of the fin.

Gate-all-around FinFETs have improved electrostatics over tri-gate or double-gate devices due to improved gate control. However, nanowires tend to have a smaller perimeter than fins, and also larger external resistance due to the under-spacer component.

SUMMARY

In general, exemplary embodiments of the invention include fin field-effect transistor (FinFET) devices and methods of manufacturing same and, in particular, gate-all-around FinFET devices formed using condensation.

According to an exemplary embodiment of the present invention, a method for manufacturing a fin field-effect transistor (FinFET) device comprises patterning a first layer on a substrate to form at least one fin, patterning a second layer under the first layer to remove a portion of the second layer on sides of the at least one fin, forming a sacrificial gate electrode on the at least one fin, and a spacer on the sacrificial gate electrode, selectively removing the sacrificial gate electrode, depositing an oxide layer on top and side portions of the at least one fin corresponding to a channel region of the at least one fin, performing thermal oxidation to condense the at least one fin in the channel region until a bottom portion of the at least one fin is undercut, and stripping a resultant oxide layer from the thermal oxidation, leaving a gap in the channel region between a bottom portion of the at least one fin and the second layer.

According to an exemplary embodiment of the present invention, a method for manufacturing a fin field-effect transistor (FinFET) device comprises patterning a first layer on a substrate to form at least one fin, forming a sacrificial gate electrode on the at least one fin, and a spacer on the sacrificial gate electrode, selectively removing the sacrificial gate electrode, depositing an oxide layer on top and side portions of the at least one fin corresponding to a channel region of the at least one fin, performing thermal oxidation to condense the at least one fin in the channel region until a bottom portion of the at least one fin is undercut, and stripping a resultant oxide layer from the thermal oxidation, leaving a gap in the channel region between a bottom portion of the at least one fin and a second layer under the at least one fin.

According to an exemplary embodiment of the present invention, a fin field-effect transistor (FinFET) device comprises at least one fin formed on an oxide layer, a gap in a channel region of the at least one fin between a bottom portion of the at least one fin and the oxide layer, wherein the gap includes an undercut in the bottom portion of the at least one fin, and a recessed portion of the oxide layer, and a gate structure around the at least one fin, including in the gap on an underside of the at least one fin.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to fin field-effect transistor (FinFET) devices and methods of manufacturing same and, in particular, gate-all-around FinFET devices formed using condensation. This invention may, however, be embodied in many different forms and should not be construed as limited to the embodiments set forth herein.

In accordance with an embodiment of the present invention, a gate-all-around FinFET is formed by a process using thermal oxidation after a poly pull process (e.g., removal of a sacrificial gate) in a replacement metal-gate flow in order to condense a fin. The thermal oxidation causes a portion of the fin to be oxidized, resulting in condensation of the fin at side and bottom portions. A bottom portion of the fin is thereby undercut. After removing (e.g., pulling) the sacrificial gate, a portion of a silicon germanium (SiGe) fin is thermally oxidized to form high germanium (Ge) content, until a bottom of the fin is fully oxidized to condense a portion of the fin.

During subsequent stripping of the oxide portions, a portion of a buried oxide (BOX) layer on which the fin is formed is also removed, resulting in a gap underneath the fin where a gate structure, which forms an underside portion of a gate-all-around structure, can be formed. In accordance with an embodiment of the present invention, an approximately 15 nm gap is formed under the fin. In order to achieve the 15 nm gap under the fin, the BOX layer is intentionally recessed by about 10 nm so that the gap under the fin after condensation and oxide removal is not solely determined by the oxidation and condensation. Instead, the intentional BOX recess increases the gap.

After high-k dielectric fill (approximately 5 nm underneath the fin and approximately 5 nm on the oxide layer) in the replacement metal gate process, an approximately 5 nm gap is available for filling the fin bottom with low resistance metal (e.g., Tungsten).

The final structure is a gate-all-around FinFET with large channel perimeter, improved electrostatics over traditional FinFETs, and anchoring underneath a spacer for reduced external resistance.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

It is also to be understood that while the drawings and discussion may reference formation of a single element, such as a fin, gate, source/drain region, etc. in a particular step of a process, the methods and devices disclosed herein, in accordance with embodiments of the present invention, are used to form a plurality of those elements in the particular step simultaneously, as would be understood by one of ordinary skill in the art. To the extent required, the methods and devices disclosed herein, in accordance with embodiments of the present invention, can also be used to form the single element in the particular step if necessary.

The FinFET devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of embodiments of the invention provided herein, one of ordinary skill in the art will be able to contemplate other implementations and applications of embodiments of the invention.

Figure 1A:
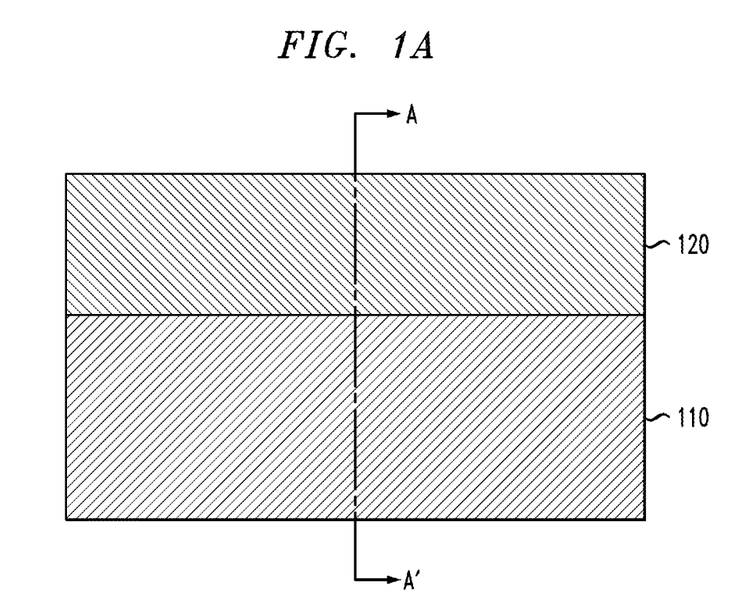
FIG. 1A is a cross-sectional view taken along a line parallel to an extension direction along a side of the illustrated layers to illustrate formation of an SiGe layer in a method of manufacturing a FinFET device, according to an exemplary embodiment of the present invention.
Figure 1B:
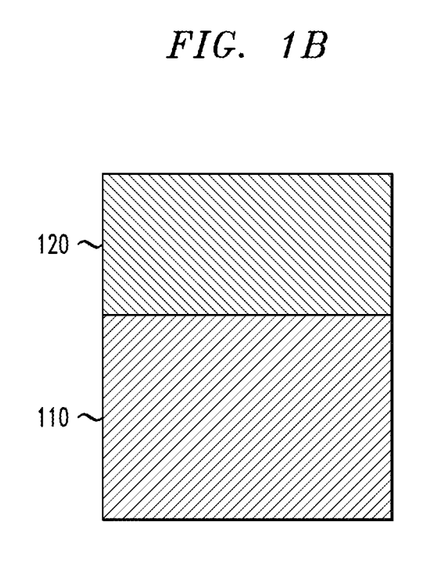
FIG. 1B is a cross-sectional view taken along line A-A' in FIG. 1A to show a front view of the illustrated layers, according to an exemplary embodiment of the present invention.

FIG. 1A is a cross-sectional view taken along a line parallel to an extension direction along a side of layers 110 and 120 to illustrate formation of an SiGe layer in a method of manufacturing a FinFET device, according to an exemplary embodiment of the present invention. FIG. 1B is a cross-sectional view taken along line A-A' in FIG. 1A to show a front view of the layers 110 and 120. Referring to FIGS. 1A and 1B, a buried insulating layer 110, such as, for example, a buried oxide (BOX) layer, is located on an upper surface of a semiconductor substrate (not shown). A semiconductor substrate can be, for example, a silicon-on-insulator (SOI) substrate or a bulk substrate comprising semiconductor material including, but not limited to, Si, SiGe, SiC, SiGeC or other like semiconductor. In addition, multiple layers of the semiconductor materials can be used as the semiconductor material of the substrate.

Referring to FIGS. 1A and 1B, a layer 120 of SiGe is formed. In the case of an SOI substrate, in accordance with an embodiment of the present invention, after SiGe epitaxial growth on an SOI layer, the SiGe/SOI bilayer is converted into a single SiGe layer 120 by, for example, thermal mixing or condensation.

Figure 2A:
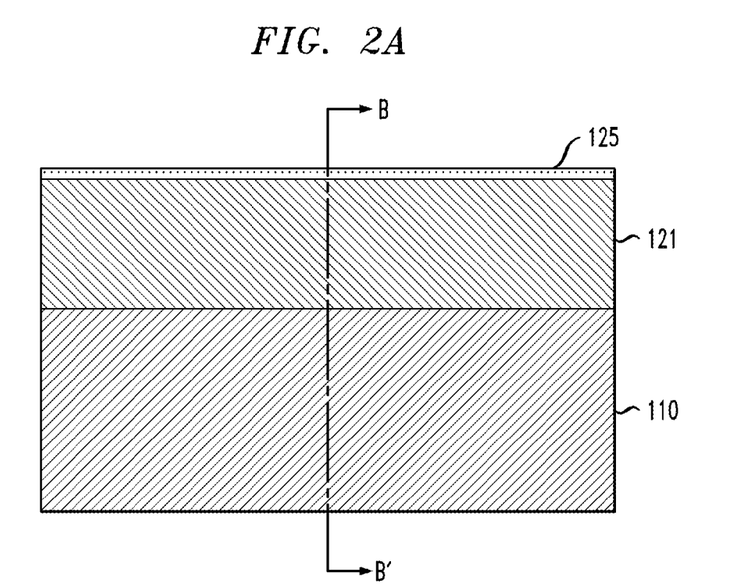
FIG. 2A is a cross-sectional view taken along a line parallel to an extension direction along a side of a fin to illustrate fin formation in a method of manufacturing a FinFET device, according to an exemplary embodiment of the present invention.
Figure 2B:
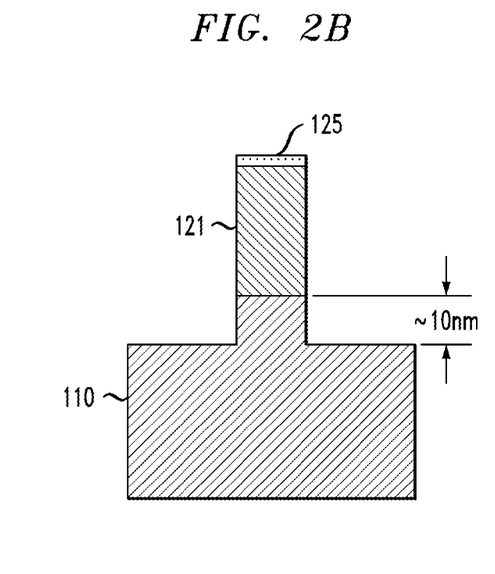
FIG. 2B is a cross-sectional view taken along line B-B' in FIG. 2A to show a front view of the fin, according to an exemplary embodiment of the present invention.

FIG. 2A is a cross-sectional view taken along a line parallel to an extension direction along a side of a fin 121 to illustrate fin formation in a method of manufacturing a FinFET device, according to an exemplary embodiment of the present invention. FIG. 2B is a cross-sectional view taken along line B-B' in FIG. 2A to show a front view of the fin 121.

Fins, such as fin 121, are formed by patterning an SOI layer, such as SiGe layer 120 (or a top portion of a bulk substrate if one is used) into the fins. The SOI layer may alternatively comprise semiconductor material other than SiGe including, but not limited to, Si, SiC, SiGeC or other like semiconductor. In addition, multiple layers of the semiconductor materials can be used as the semiconductor material of the SOI layer. A hard mask 125 comprising, for example, a high-K dielectric material, is formed on portions of the SiGe layer 120 that are to be formed into the fins, and patterning is performed by a method known in the art, for example, sidewall image transfer and etching. In accordance with an embodiment of the present invention, fins, such as fin 121, are patterned to be wider than usual, for example to widths of about 18 nm-about 20 nm in order to compensate for the condensation of the fins as a result of the thermal oxidation. As shown in FIG. 2B, the patterning intentionally removes portions of the BOX layer 110 on sides of the fin 121 (e.g., left and right sides as shown in FIG. 2B) by about 10 nm, so that in a subsequent step, when oxide is etched, a resulting gap height will be greater than the oxide etch amount.

Figure 3A:
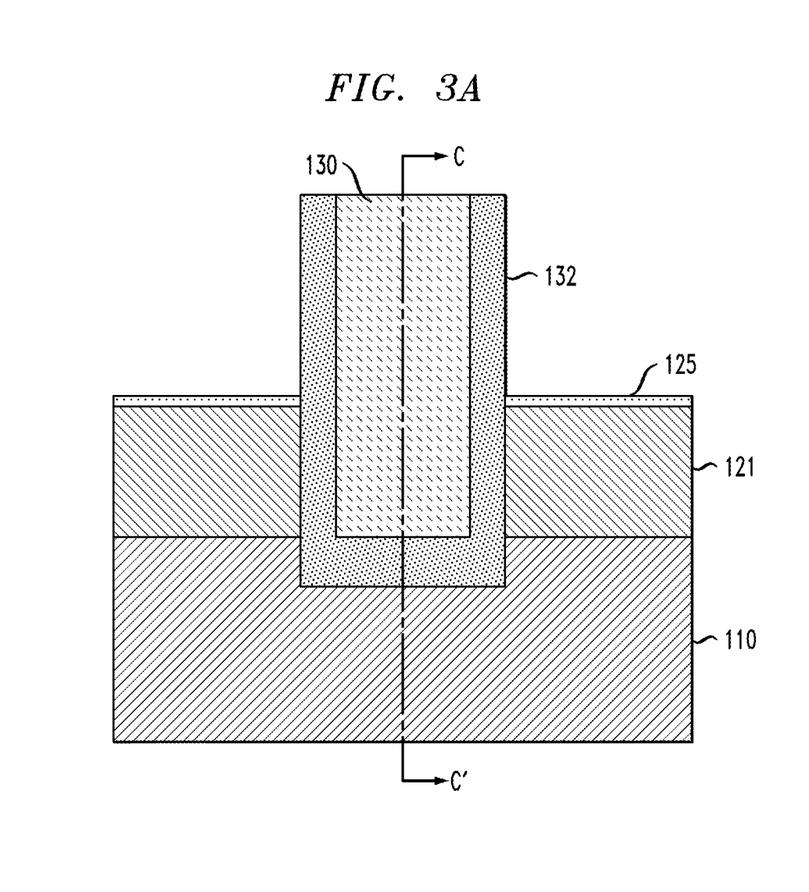
FIG. 3A is a cross-sectional view taken along a line parallel to an extension direction along a side of a fin to illustrate sacrificial gate and spacer formation in a method of manufacturing a FinFET device, according to an exemplary embodiment of the present invention.
Figure 3B:
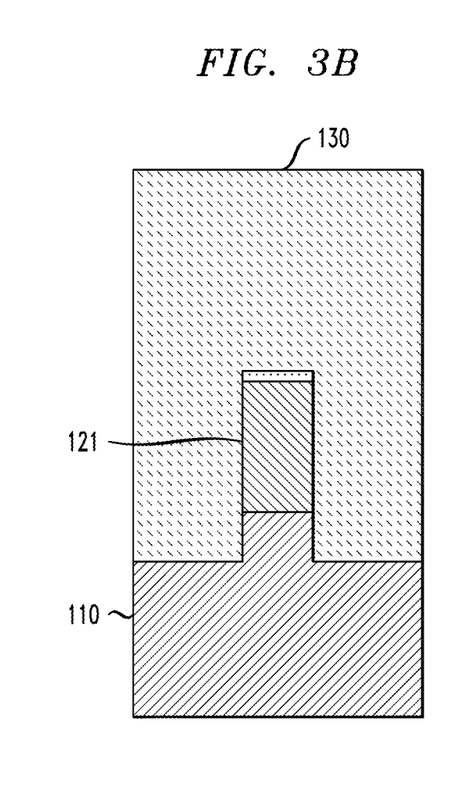
FIG. 3B is a cross-sectional view taken along line C-C' in FIG. 3A to show a front view, according to an exemplary embodiment of the present invention.

FIG. 3A is a cross-sectional view taken along a line parallel to an extension direction along a side of a fin 121 to illustrate sacrificial gate and spacer formation in a method of manufacturing a FinFET device, according to an exemplary embodiment of the present invention. FIG. 3B is a cross-sectional view taken along line C-C' in FIG. 3A to show a front view. Referring to FIGS. 3A and 3B, polysilicon (poly-Si) sacrificial gate electrodes and spacers, such as sacrificial gate electrode 130 and spacer 132, can be formed by, for example, a replacement metal gate (RMG) process including sacrificial gate lithography and patterning, and spacer formation.

In an alternative embodiment, the sacrificial gate electrode 130 is made of, for example, an amorphous silicon material, or other suitable materials. The spacer 132 can comprise, for example, nitride, a silicon oxide ($SiO_x$), boron nitride (BN), silicon carbon nitro-oxide (SiCNO), and silicon carbon nitride (SiCN). The sacrificial gate and spacer 130 and 132 may be formed by any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD).

A spacer layer can be patterned by, for example, an isotropic etching process, such as reactive ion etching (RIE), to form the spacer 132 along sides of a sacrificial gate electrode 130, and eventually along sides of the metal gate structure, once the sacrificial gate electrodes are removed and replaced by the metal gate structure. The spacer can be formed from, for example, oxides, nitrides or a combination thereof, such as, for example, silicon oxide, silicon nitride, silicon oxynitride, boron nitride, and/or silicon boron nitride.

Figure 4A:
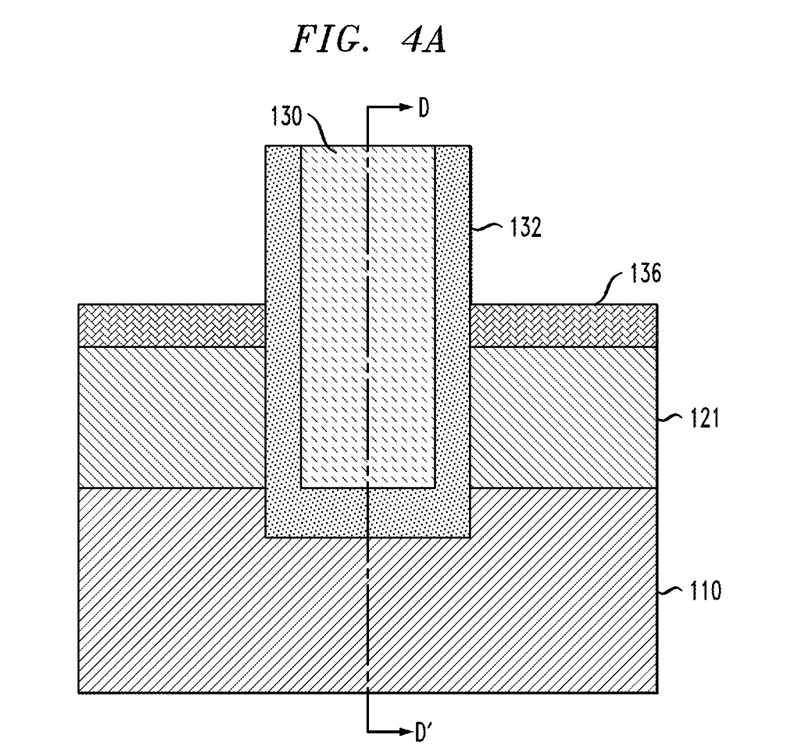
FIG. 4A is a cross-sectional view taken along a line parallel to an extension direction along a side of a fin to illustrate growth of doped source/drain (S/D) regions in a method of manufacturing a FinFET device, according to an exemplary embodiment of the present invention.
Figure 4B:
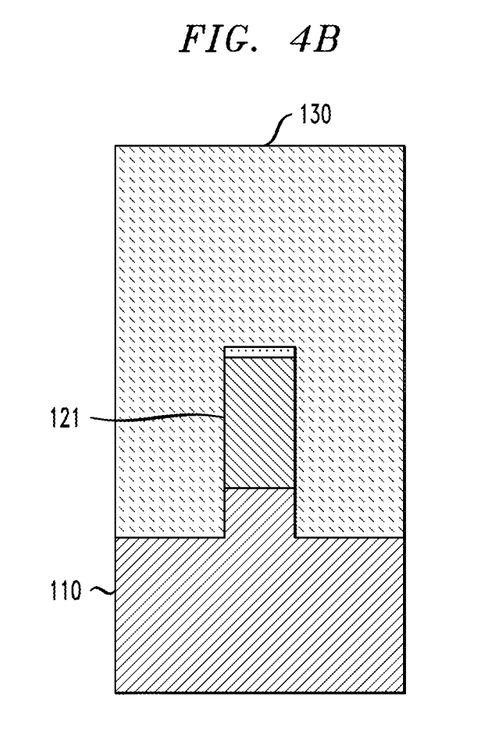
FIG. 4B is a cross-sectional view taken along line D-D' in FIG. 4A to show a front view, according to an exemplary embodiment of the present invention.

FIG. 4A is a cross-sectional view taken along a line parallel to an extension direction along a side of a fin 121 to illustrate growth of doped source/drain (S/D) regions 136 in a method of manufacturing a FinFET device, according to an exemplary embodiment of the present invention. FIG. 4B is a cross-sectional view taken along line D-D' in FIG. 4A to show a front view. Referring to FIGS. 4A and 4B, the hard mask 125 is removed from the regions of the fin corresponding to the S/D regions, P-type S/D Si with a doping density above $10^{20}$ cm$^{-3}$ is grown on the exposed portions of the fins as the S/D regions 136, and the dopants are activated. As can be seen, the S/D regions 136 are located on the fin 121 adjacent sides of the spacer 132. The dopant introduced during epitaxial growth can include, for example, boron. It is to be understood that the embodiments of the present invention are not necessarily limited to the aforementioned dopant and dopant density.

Figure 5A:
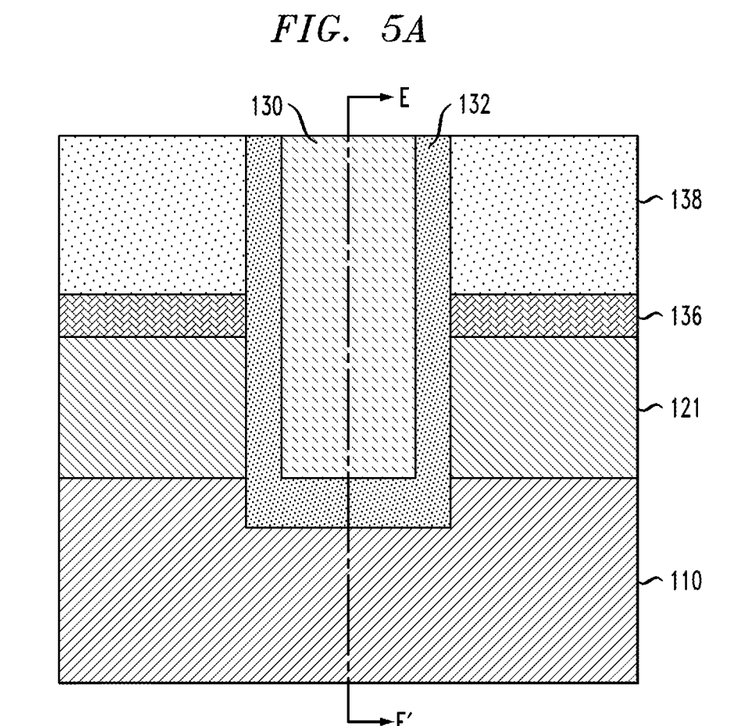
FIG. 5A is a cross-sectional view taken along a line parallel to an extension direction along a side of a fin to illustrate formation of an interlayer dielectric (ILD) layer in a method of manufacturing a FinFET device, according to an exemplary embodiment of the present invention.
Figure 5B:
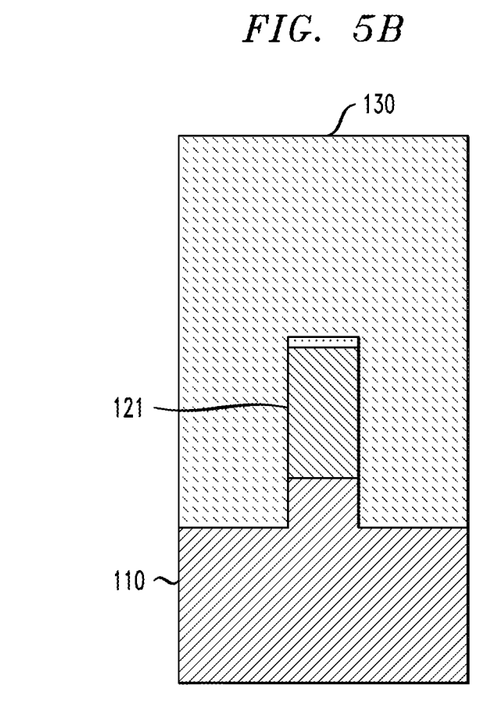
FIG. 5B is a cross-sectional view taken along line E-E' in FIG. 5A to show a front view according to an exemplary embodiment of the present invention.

FIG. 5A is a cross-sectional view taken along a line parallel to an extension direction along a side of a fin 121 to illustrate formation of an interlayer dielectric (ILD) layer 138 in a method of manufacturing a FinFET device, according to an exemplary embodiment of the present invention. FIG. 5B is a cross-sectional view taken along line E-E' in FIG. 5A to show a front view. Referring to FIGS. 5A and 5B, a layer of, for example, silicon dioxide ($SiO_2$), low-temperature oxide (LTO), high-temperature oxide (HTO), or field oxide (FOX) is formed on the structure in FIGS. 4A and 4B using a deposition process, such as, for example, CVD, PECVD, PVD, ALD, MBD, PLD, and/or LSMCD. The deposited layer is planarized using a planarization process, such as, for example, chemical mechanical polishing (CMP), to result in ILD layer 138. As can be seen, the ILD layer is located on the S/D regions 136 adjacent sides of the spacer 132.

Figure 6A:
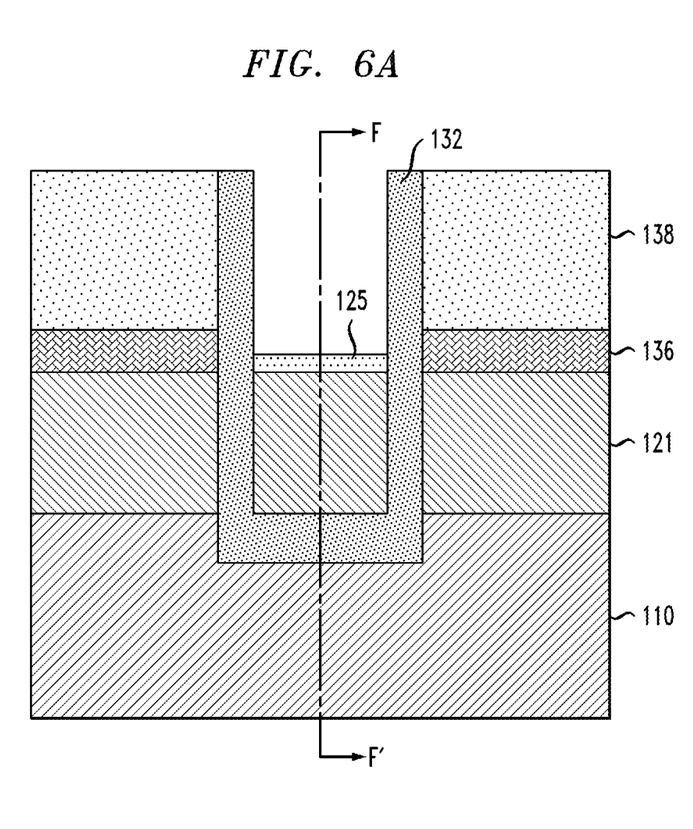
FIG. 6A is a cross-sectional view taken along a line parallel to an extension direction along a side of a fin to illustrate removal of a sacrificial gate in a method of manufacturing a FinFET device, according to an exemplary embodiment of the present invention.
Figure 6B:
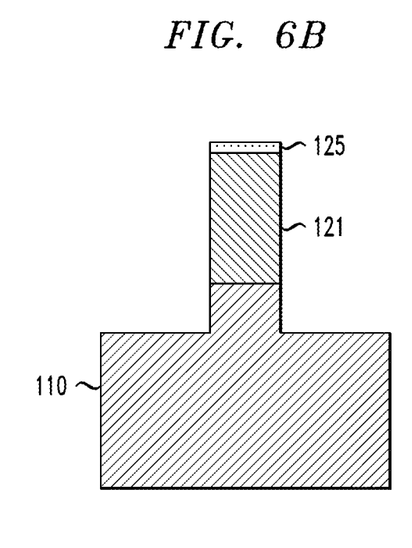
FIG. 6B is a cross-sectional view taken along line F-F' in FIG. 6A to show a front view, according to an exemplary embodiment of the present invention.

FIG. 6A is a cross-sectional view taken along a line parallel to an extension direction along a side of a fin 121 to illustrate removal of a sacrificial gate 130 in a method of manufacturing a FinFET device, according to an exemplary embodiment of the present invention. FIG. 6B is a cross-sectional view taken along line F-F' in FIG. 6A to show a front view. Referring to FIGS. 6A and 6B, a sacrificial gate 130 is removed by any suitable etching process capable of selectively removing the sacrificial gate 130 without substantially removing material from the spacer 132 to form a gate cavity. A channel region of the fin 121 includes a portion of the fin 121 between the spacer 132. The sacrificial gate 130 may be removed by, for example, a reactive ion etching (RIE) process, which can selectively remove silicon to remove the sacrificial gate electrode, and, for example, a hydrofluoric acid-containing wet etch to remove a sacrificial gate dielectric layer.

Figure 7A:
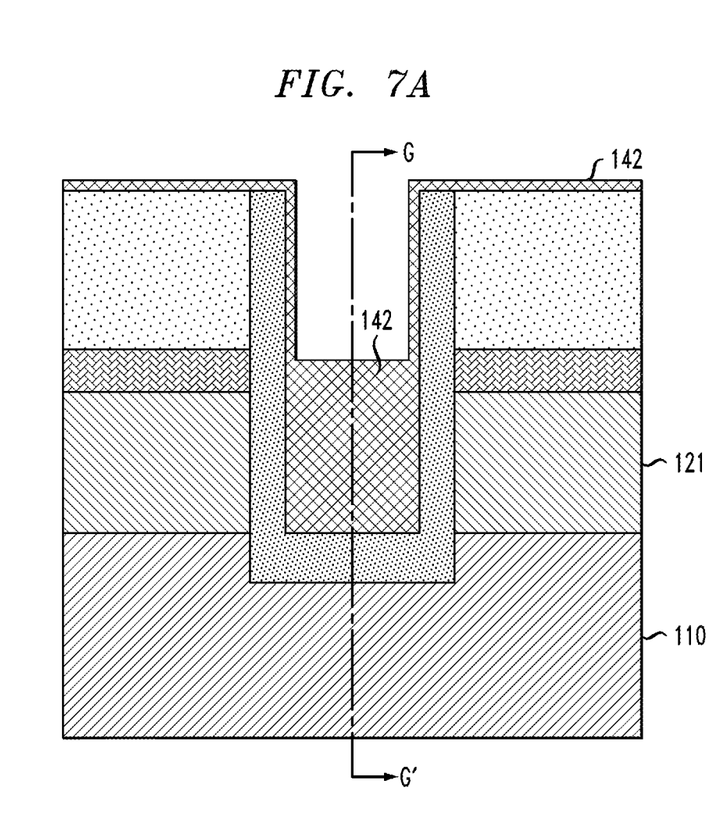
FIG. 7A is a cross-sectional view taken along a line parallel to an extension direction along a side of a fin to illustrate formation of an oxide in a method of manufacturing a FinFET device, according to an exemplary embodiment of the present invention.
Figure 7B:
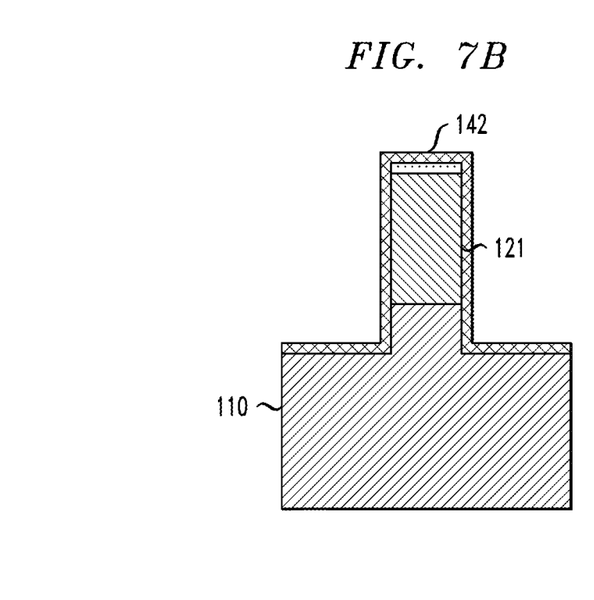
FIG. 7B is a cross-sectional view taken along line G-G' in FIG. 7A to show a front view, according to an exemplary embodiment of the present invention.

FIG. 7A is a cross-sectional view taken along a line parallel to an extension direction along a side of a fin 121 to illustrate formation of an oxide in a method of manufacturing a FinFET device, according to an exemplary embodiment of the present invention. FIG. 7B is a cross-sectional view taken along line G-G' in FIG. 7A to show a front view. Referring to FIGS. 7A and 7B, an oxide layer 142 is deposited on spacer 132, on the hard mask 125, and on sides of the fin 121 in the cavity left by removal of the sacrificial gate 130, and on top the ILD layer 138 and spacer 132 outside of the cavity left by removal of the sacrificial gate 130, as well as on the BOX layer 110 adjacent the fin 121. The oxide 142 can be, for example, $SiO_2$, and deposited using, for example, CVD, PECVD, chemical solution deposition, evaporation, PVD, a spin-on technique, ALD, or any suitable combination of these techniques. In one example, the oxide 142 can be formed by CVD at a deposition temperature from about 200° C. to about 500° C. In another example, the oxide 142 is formed by a spin-on technique.

Figure 8A:
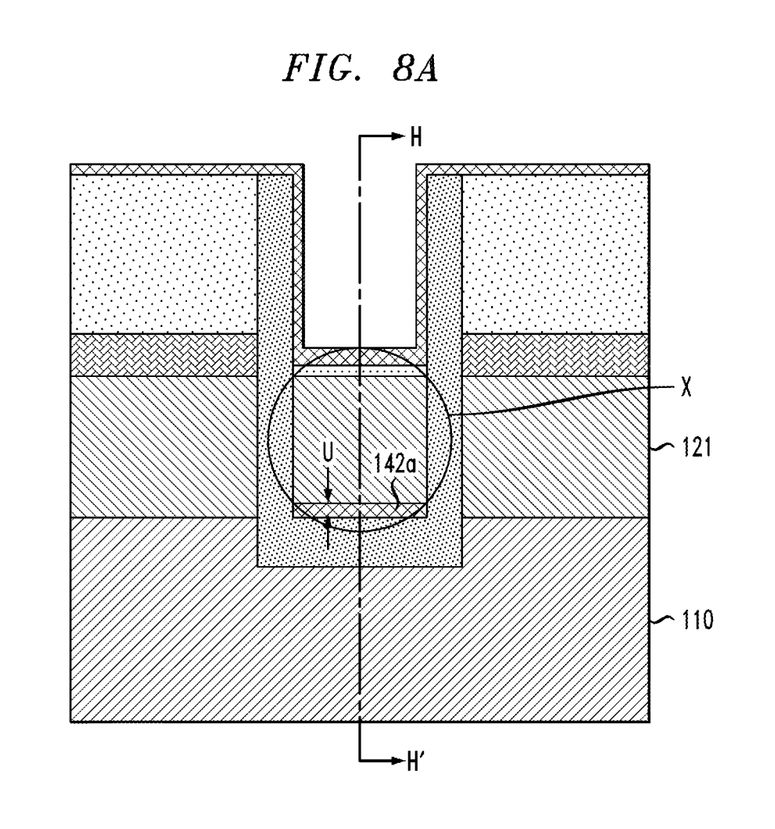
FIG. 8A is a cross-sectional view taken along a line parallel to an extension direction along a side of a fin to illustrate a thermal oxidation process in a method of manufacturing a FinFET device, according to an exemplary embodiment of the present invention.
Figure 8B:
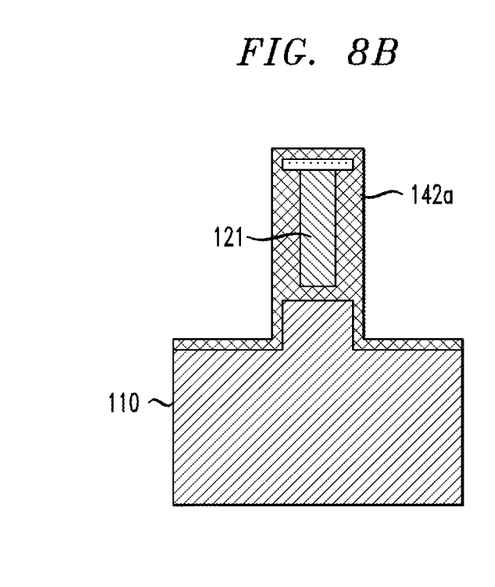
FIG. 8B is a cross-sectional view taken along line H-H' in FIG. 8A to show a front view, according to an exemplary embodiment of the present invention.

FIG. 8A is a cross-sectional view taken along a line parallel to an extension direction along a side of a fin 121 to illustrate a thermal oxidation process in a method of manufacturing a FinFET device, according to an exemplary embodiment of the present invention. FIG. 8B is a cross-sectional view taken along line H-H' in FIG. 8A to show a front view. Referring to FIGS. 8A and 8B, the resultant oxide layer 142a on one side of the fin 121 is omitted from the circled portion X in FIG. 8A to illustrate that the fin 121 includes an undercut U as a result of condensation of the fin caused by thermal oxidation.

According to an embodiment of the present invention, during the thermal oxidation process, the silicon germanium is oxidized and the silicon from the surface of the SiGe fin is consumed, and forms silicon dioxide ($SiO_2$), thereby condensing the fin at side and bottom portions thereof, as can be seen by the difference in fin size from FIG. 7B to FIG. 8B, as well as from the undercut U in FIG. 8A. Accordingly, as can be seen in FIGS. 7B and 8B, the resultant oxide layer 142a, which includes oxide layer 142, is thicker on the side and bottom portions of the fin 121 than oxide layer 142 due to the thermal oxidation. By way of further explanation, in accordance with an embodiment of the present invention, the Si atoms in the SiGe fin 121 bond with oxygen that is available during the condensation process and form additional $SiO_2$. As a result, the thickness of the fin 121 decreases because Si is being converted to $SiO_2$. In addition, because only Si bonds with the oxygen and not Ge, the final Ge concentration in the fin 121 is higher than what it was before the condensation process.

The hard mask 125 on a top portion of the fin 121 is oxygen impermeable. Since an oxygen impermeable hard mask 125 is present on a top portion of the fin 121, the fin 121 is not condensed from a top portion of the fin 121. However, the oxide 142 is oxygen permeable. Since the oxide 142 is oxygen permeable, the thermal condensation process proceeds at side and bottom portions of the fin 121. As used herein, "oxygen permeable" material refers to a material having an oxygen diffusion rate that exceeds 50% of the oxygen diffusion rate in silicon oxide formed by thermal oxidation. An "oxygen permeable" material can have an oxygen diffusion rate that exceeds 100% of the oxygen diffusion rate in silicon oxide formed by thermal oxidation.

The condensation is the result of a thermal oxidation process that is performed at a temperature sufficient enough to cause oxidation of the Si in the epitaxial SiGe. In one embodiment of the present invention, the thermal oxidation is performed at a temperature from about 700° C. to about 1300° C. In another embodiment of the present invention, the thermal oxidation is performed at a temperature from about 1000° C. to about 1200° C.

In accordance with an embodiment of the present invention, the thermal oxidation is performed in an oxidizing ambient which includes at least one oxygen-containing gas such as, for example, $O_2$, NO, $N_2O$, ozone, air and other like oxygen-containing gases. The oxygen-containing gases may be admixed with each other (such as an admixture of $O_2$ and NO), or the gas may be diluted with an inert gas such as, for example, He, Ar, $N_2$, Xe, Kr, or Ne.

In accordance with an embodiment of the present invention, the thermal oxidation may be carried out for a variable period of time. In one example, the thermal oxidation process is carried out for a time period from about 5 seconds to about 5 hours, depending on thermal oxidation temperature and oxidation species. In another embodiment, the thermal oxidation process may be carried out for a time period from about 5 minutes to about 30 minutes. The thermal oxidation process may be carried out at a single targeted temperature, or various ramp and soak cycles using various ramp rates and soak times can be employed.

Figure 9A:
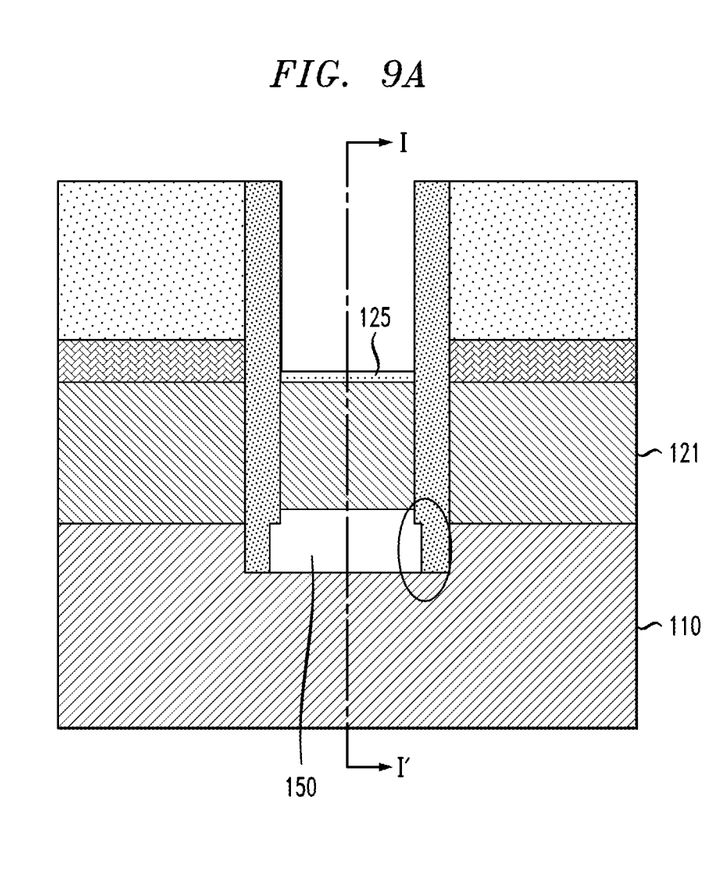
FIG. 9A is a cross-sectional view taken along a line parallel to an extension direction along a side of a fin to illustrate stripping of an oxide in a method of manufacturing a FinFET device, according to an exemplary embodiment of the present invention.
Figure 9B:
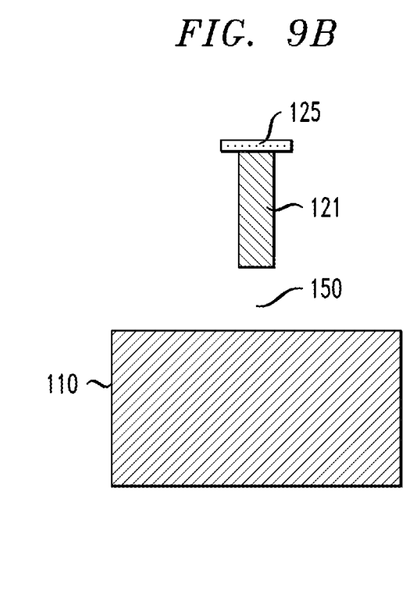
FIG. 9B is a cross-sectional view taken along line I-I' in FIG. 9A to show a front view, according to an exemplary embodiment of the present invention.

FIG. 9A is a cross-sectional view taken along a line parallel to an extension direction along a side of a fin 121 to illustrate stripping of the resultant oxide 142a in a method of manufacturing a FinFET device, according to an exemplary embodiment of the present invention. FIG. 9B is a cross-sectional view taken along line I-I' in FIG. 9A to show a front view. Referring to FIGS. 9A and 9B, the resultant oxide 142a is stripped, leaving a suspended fin in the channel region only. It is to be understood that FIG. 9B omits the stepped surfaces in the circled portion of the spacer layer 132 in FIG. 9A in order to emphasize the suspended configuration of the fin 121 in the channel region. As can be understood from FIG. 9A, the fin 121 is supported on the BOX layer 110 in the S/D regions so that the fin 121 is not actually "floating" as shown in FIG. 9B.

In accordance with an embodiment of the present invention, during stripping of the resultant oxide portions 142a, a portion of a buried oxide (BOX) layer 110 on which the fin is formed in the channel region is also removed, resulting in a gap 150 underneath the fin where a gate structure, which forms an underside portion of a gate-all-around structure, can be formed. In accordance with an embodiment of the present invention, an approximately 15 nm gap is formed under the fin. In order to achieve the 15 nm gap under the fin 121, the BOX layer 110 is intentionally recessed by about 10 nm as shown in FIG. 2B so that the gap 150 under the fin after condensation and oxide removal is not solely determined by the oxidation and condensation. Instead, the intentional BOX recess results in an increased gap 150. It is to be understood that the embodiments of the present invention are not necessarily limited to a 15 nm gap or a 10 nm recess, and that other sized gaps and recesses are contemplated depending on design constraints and/or requirements.

According to an embodiment of the present invention, the resultant oxide 142a and the protruding portion of BOX layer 110 underneath the SiGe fin 121 are removed by etching from both sides, resulting in the gap 150 underneath the SiGe fin 121 larger than the thickness of the resultant oxide 142a. The oxide can be stripped by using a selective etch process which removes oxide.

Figure 10A:
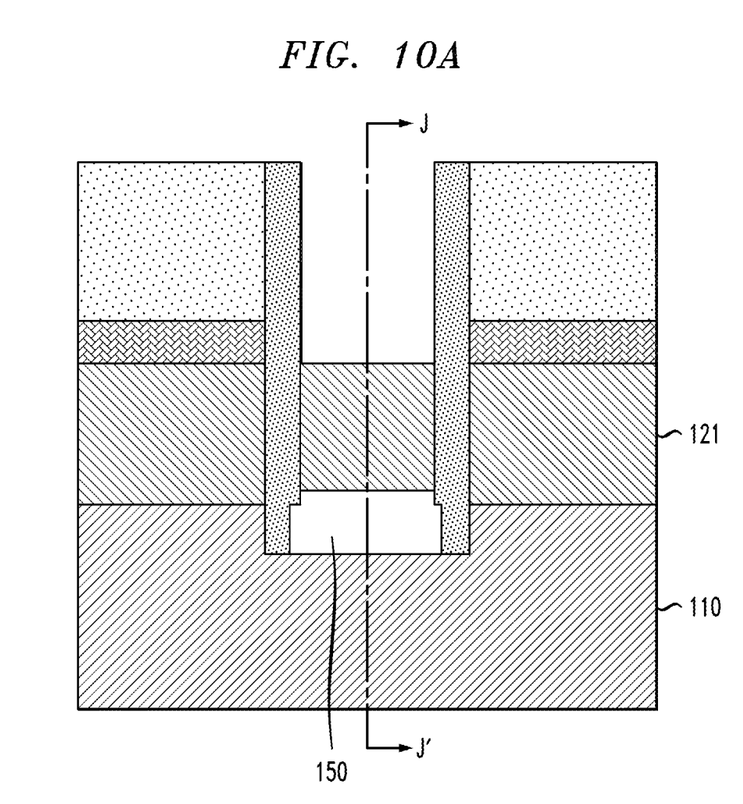
FIG. 10A is a cross-sectional view taken along a line parallel to an extension direction along a side of a fin to illustrate removal of a hard mask in a method of manufacturing a FinFET device, according to an exemplary embodiment of the present invention.
Figure 10B:
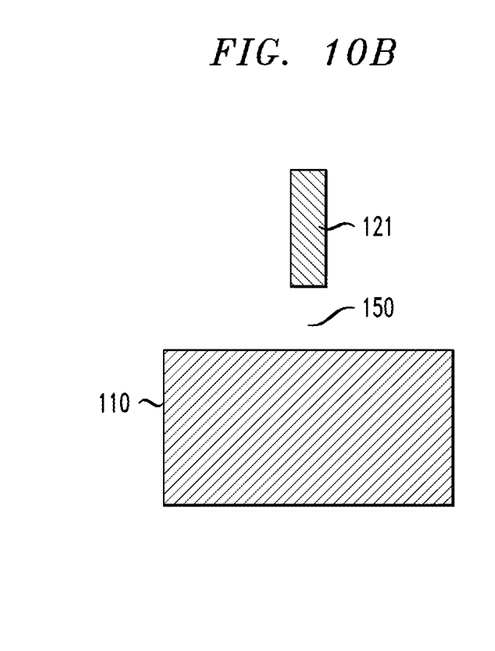
FIG. 10B is a cross-sectional view taken along line J-J' in FIG. 10A to show a front view, according to an exemplary embodiment of the present invention.

FIG. 10A is a cross-sectional view taken along a line parallel to an extension direction along a side of a fin 121 to illustrate removal of the hard mask 125 in a method of manufacturing a FinFET device, according to an exemplary embodiment of the present invention. FIG. 10B is a cross-sectional view taken along line J-J' in FIG. 10A to show a front view. Referring to FIGS. 10A and 10B, the hard mask 125 is removed by any one of various chemical etching processes.

Figure 11A:
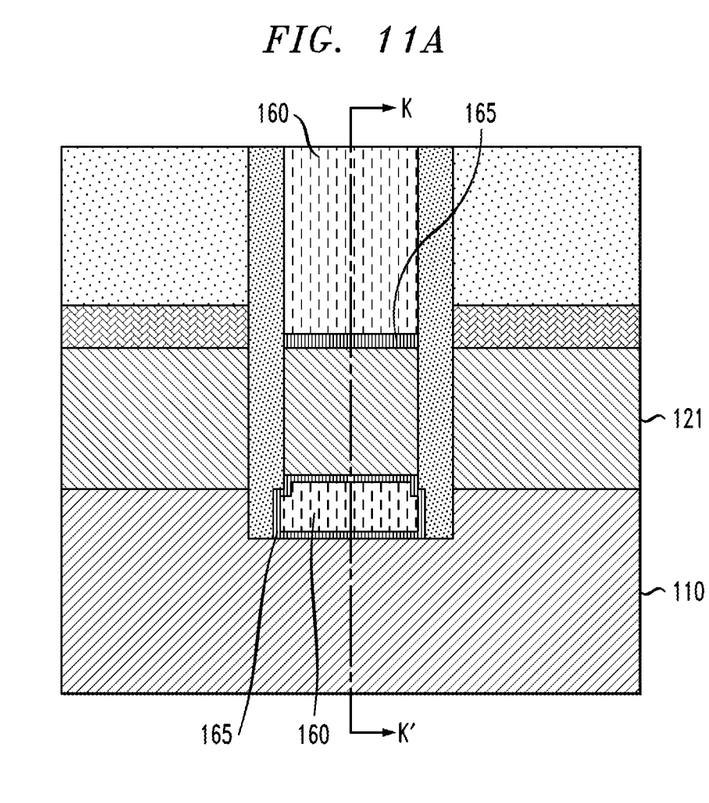
FIG. 11A is a cross-sectional view taken along a line parallel to an extension direction along a side of a fin to illustrate metal gate formation in a method of manufacturing a FinFET device, according to an exemplary embodiment of the present invention.
Figure 11B:
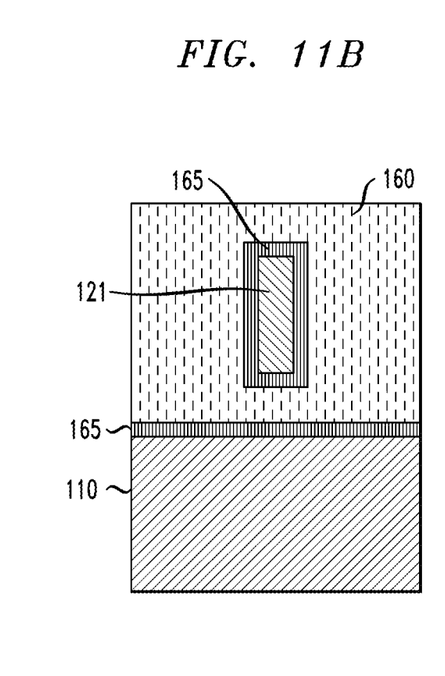
FIG. 11B is a cross-sectional view taken along line K-K' in FIG. 11A to show a front view, according to an exemplary embodiment of the present invention.

FIG. 11A is a cross-sectional view taken along a line parallel to an extension direction along a side of a fin 121 to illustrate metal gate formation in a method of manufacturing a FinFET device, according to an exemplary embodiment of the present invention. FIG. 11B is a cross-sectional view taken along line K-K' in FIG. 11A to show a front view. Referring to FIGS. 11A and 11B, a replacement metal gate structure includes low resistance metal 160, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof, and high-K dielectric 165 such as, for example, $HfO_2$ (hafnium oxide). The replacement metal gate structure fills the gap 150 to create a gate all-around structure, and may be formed using, for example, deposition techniques such as CVD, PVD, and ALD, sputtering, and/or plating. The gate structure is planarized using, for example, CMP.

Figure 12A:
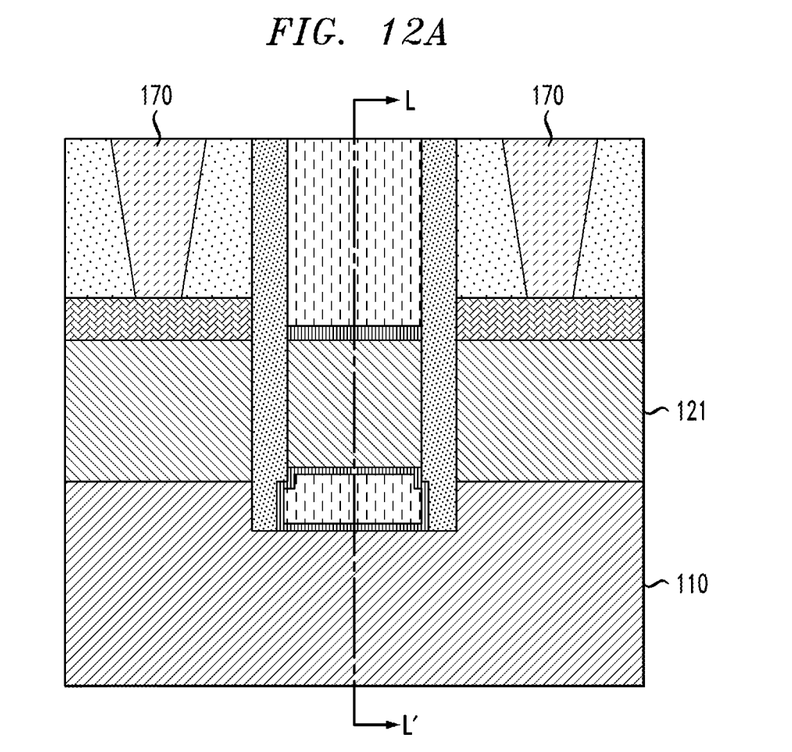
FIG. 12A is a cross-sectional view taken along a line parallel to an extension direction along a side of a fin to illustrate S/D contact formation in a method of manufacturing a FinFET device, according to an exemplary embodiment of the present invention.
Figure 12B:
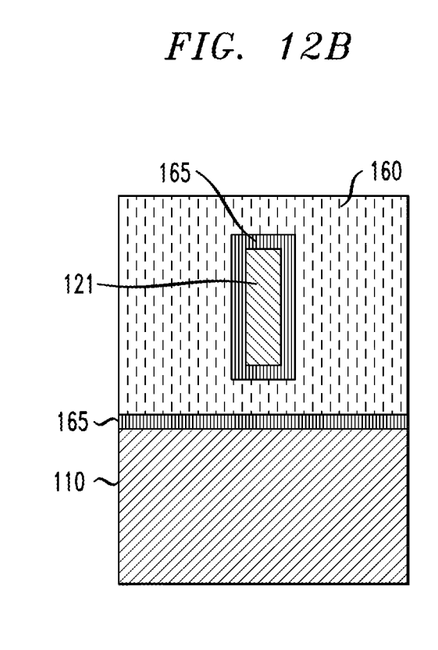
FIG. 12B is a cross-sectional view taken along line L-L' in FIG. 12A to show a front view, according to an exemplary embodiment of the present invention.

FIG. 12A is a cross-sectional view taken along a line parallel to an extension direction along a side of a fin 121 to illustrate S/D contact formation in a method of manufacturing a FinFET device, according to an exemplary embodiment of the present invention. FIG. 12B is a cross-sectional view taken along line L-L' in FIG. 12A to show a front view. Referring to FIGS. 12A and 12B, vias are etched into the ILD layer 138 down to the S/D regions 136, and the vias are filled with a conductive metal to form contacts 170. The contacts 170 can be, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The metal contacts 170 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A fin field-effect transistor (FinFET) device, comprising:
   at least one fin formed on an oxide layer;
   a gap in a channel region of the at least one fin between a bottom portion of the at least one fin and the oxide layer, wherein the gap includes an undercut in the bottom portion of the at least one fin, and a recessed portion of the oxide layer;
   a gate structure around the at least one fin, including in the gap on an underside of the at least one fin; and
   a spacer layer formed on a side of the gap;
   wherein the gap includes a stepped portion between the undercut and the recessed portion; and
   wherein the stepped portion is formed in the spacer layer.

2. The fin field-effect transistor (FinFET) device of claim 1, wherein the gate structure comprises a dielectric layer formed on the spacer layer and on the stepped portion.

3. The fin field-effect transistor (FinFET) device of claim 2, wherein the gate structure further comprises a metal layer formed on the dielectric layer.

4. The fin field-effect transistor (FinFET) device of claim 2, wherein the dielectric layer is further formed an underside of the bottom portion of the at least one fin.

5. The fin field-effect transistor (FinFET) device of claim 1, wherein the gate structure comprises a dielectric layer formed around the at least one fin, and a metal layer formed on the dielectric layer.

6. A semiconductor device, comprising:
   at least one fin formed on an oxide layer, wherein the at least one fin comprises silicon germanium;
   a gap in a channel region of the at least one fin between a bottom portion of the at least one fin and the oxide layer, wherein the gap includes an undercut in the bottom portion of the at least one fin, and a recessed portion of the oxide layer;
   a gate structure around the at least one fin, including in the gap on an underside of the at least one fin; and
   a spacer layer formed on a side of the gap;
   wherein the gap includes a stepped portion between the undercut and the recessed portion; and
   wherein the stepped portion is formed in the spacer layer.

7. The semiconductor device of claim 6, wherein the gate structure comprises a dielectric layer formed on the spacer layer and on the stepped portion.

8. The semiconductor device of claim 7, wherein the gate structure further comprises a metal layer formed on the dielectric layer.

9. The semiconductor device of claim 7, wherein the dielectric layer is further formed an underside of the bottom portion of the at least one fin.

10. The semiconductor device of claim 6, wherein the gate structure comprises a dielectric layer formed around the at least one fin, and a metal layer formed on the dielectric layer.

* * * * *